United States Patent
Hong

(10) Patent No.: US 8,154,701 B2
(45) Date of Patent: Apr. 10, 2012

(54) LIQUID CRYSTAL DISPLAY DEVICE WITH LINK LINES CONNECTING TO TAPE CARRIER PACKAGE

(75) Inventor: Jin Cheol Hong, Gyeongsangbuk-Do (KR)

(73) Assignee: LG Display Co., Ltd., Seoul (KR)

(*) Notice: Subject to any disclaimer, the term of this patent is extended or adjusted under 35 U.S.C. 154(b) by 167 days.

(21) Appl. No.: 10/921,270

(22) Filed: Aug. 19, 2004

(65) Prior Publication Data
US 2005/0041190 A1 Feb. 24, 2005

(30) Foreign Application Priority Data
Aug. 20, 2003 (KR) .................. 10-2003-0057609

(51) Int. Cl.
*G02F 1/1345* (2006.01)
*G09G 3/36* (2006.01)

(52) U.S. Cl. ........ 349/149; 349/150; 349/151; 349/152; 345/90; 345/104

(58) Field of Classification Search .......... 349/149–152; 345/90, 104
See application file for complete search history.

(56) References Cited

U.S. PATENT DOCUMENTS

| 5,818,562 A | 10/1998 | Yoon ............................. 349/149 |
| 6,621,547 B2* | 9/2003 | Kang ............................. 349/151 |
| 6,686,987 B1* | 2/2004 | Sakaki et al. ................. 349/149 |
| 6,741,309 B2* | 5/2004 | Kim et al. ..................... 349/139 |
| 6,822,720 B2* | 11/2004 | Ueda et al. .................... 349/152 |
| 2002/0012079 A1* | 1/2002 | Kim et al. ....................... 349/43 |
| 2003/0086048 A1* | 5/2003 | Ukita ............................. 349/149 |
| 2003/0095225 A1* | 5/2003 | Hsu et al. ..................... 349/149 |
| 2003/0103184 A1* | 6/2003 | Nishino ........................ 349/149 |
| 2003/0164919 A1* | 9/2003 | Oh et al. ....................... 349/149 |

FOREIGN PATENT DOCUMENTS

| CN | 1412614 | 4/2003 |
| CN | 1416001 | 5/2003 |

* cited by examiner

*Primary Examiner* — Hoan C Nguyen
(74) *Attorney, Agent, or Firm* — Morgan, Lewis & Bockius LLP

(57) ABSTRACT

A liquid crystal display device includes first and second substrates facing each other and attached to each other with a cell-gap therebetween, gate lines and data lines arranged horizontally and vertically on the first substrate, first lines formed on the first substrate, connected to the gate lines or the data lines, and each having a link bending point and bent at an angle, a TCP electrically attached to the first substrate, and second lines formed on the TCP and electrically connected to the first lines respectively. At least one link bending point is positioned at a region of the TCP.

2 Claims, 4 Drawing Sheets

LIQUID CRYSTAL DISPLAY DEVICE WITH LINK LINES CONNECTING TO TAPE CARRIER PACKAGE

The present invention claims the benefit of Korean Patent Application No. P2003-57609 filed in Korea on Aug. 20, 2003, which is hereby incorporated by reference.

BACKGROUND OF THE INVENTION

1. Field of the Invention

The present invention relates to a liquid crystal display (LCD) device, and more particularly, to a flat and light LCD device.

2. Description of the Related Art

In general, a LCD device includes a LCD panel for displaying an image, and a driving unit for driving the LCD panel. The LCD panel is fabricated by attaching a thin film transistor array substrate to a color filter substrate with a cell-gap therebetween, and filling the cell-gap with a liquid crystal material to form a liquid crystal layer. The driving unit includes a gate driving unit, a data driving unit and a printed circuit board (PCB). The gate driving unit includes a plurality of driving integrated circuits (D-IC), and supplies a scan signal to the gate lines sequentially to activate the pixels. The data driving unit also includes a plurality of D-ICs, and supplies an image signal to the pixels through the data lines.

The printed circuit board (PCB) supplies control signals and an image signal to the gate driving unit and the data driving unit. Various devices are mounted on the PCB. The PCB processes and converts externally supplied data into control signals for driving a LCD device. Then, the PCB distributes the control signals to the gate driving unit and the data driving unit.

Several methods can be used for electrically connecting the D-ICs constituting the data driving unit and the gate driving unit to the LCD panel, examples of which are tape-automated bonding (TAB) method and chip-on-glass (COG) method. In the TAB method, the D-ICs are connected to the LCD panel by electrically connecting a TCP (tape carrier package) at the location where the D-ICs are mounted to the LCD panel. An edge of the thin film transistor array substrate is exposed when the two substrates are attached because an area of the thin film transistor array substrate is larger than that of the color filter substrate. Moreover, the TCP is attached to the exposed area along the edge. One D-IC is mounted on each TCP.

In the COG method for electrically connecting the D-ICs to the LCD panel, the D-ICs are directly mounted on the LCD panel. The COG method has several advantages. For example, in the COG method, the LCD panel can be made compact because the D-ICs are directly mounted on a glass substrate of the LCD panel. However, the COG method may cause damages to the glass substrate due to the high temperature required for directly mounting the D-ICs on the glass substrate. For this reason, the TAB method, which involves simpler processes, is mainly used.

FIG. 1A is a view of a related art LCD device employing a TAB method. As shown in FIG. 1A, the LCD device includes a thin film transistor array substrate G1 and a color filter substrate G2 which are attached to each other. A plurality of TCPs 10 are electrically connected to the thin film transistor array substrate G1. A D-IC 9 is mounted on each TCP 10. A PCB 5 is connected to the TCP 10 to provide an image signal and a control signal to the thin film transistor array substrate G1 through the TCP 10. One side of the TCP 10 is connected to an edge of the thin film transistor array substrate G1. Another side of the TCP 10 is connected to the PCB 5.

Although not shown in FIG. 1A, gate lines and data lines are arranged horizontally and vertically on an LCD panel. The gate lines and the data lines are attached to the thin film transistor array substrate G1 and the color filter substrate G2, and cross each other. The crossing of the gate lines and the data lines define pixel regions in a matrix arrangement. The pixel is a minimum unit for displaying an image. The arrangement of the pixels form an active area 13 where an image is actually displayed.

FIG. 1B is an enlarged view of a portion 'A' of the related art LCD device depicted in FIG. 1A. As shown in FIG. 1B, a width ($W_T$) of the TCP 10 attached to the LCD panel is smaller than a width ($W_L$) of a region within the active area 13 where data/gate lines 20 for connection to the TCP 10 are formed. A plurality of link lines 22 are formed at the LCD panel. The plurality of link lines 22 are connected to data/gate lines 20. Because the intervals between link lines 22 are narrower than the intervals between the data/gate lines 20, the link lines 22 are spread out, like the ribs of a fan, from the TCP 10 to the active region 13 for connection to the data/gate lines 20.

FIG. 1C is an enlarged view of a portion 'B' of the related art LCD device depicted in FIG. 1B, showing a connection between a TCP output line and a link line. As shown in FIG. 1C, a link line 22 connected to a TCP output line 21 is bent at an angle for connection to the data and gate lines. The point at which a link line is bent is defined as a link bending point 25. The link lines 22 and the TCP output lines 21 are disposed at regular intervals.

To prevent the link lines 22 from short-circuiting each other, link bending points 25 are obliquely arranged between each side of the TCP 10, and a central region thereof. Accordingly, a distance of the link bending points 25 from the TCP 10 increases as the link bending points get closer to the central region of the TCP 10. Moreover, as the link bending points get closer to the central region of the TCP 10, each corresponding link line 22 is extended from one side of the TCP 10 by an extension length ($L_P$). Thus, the link bending points 25 are formed outside, not within the TCP 10 region.

The extension of the link lines 22 allows an interval to be maintained between the link lines 22 to prevent the link lines from short-circuiting each other. Such a short-circuit could generate an interference between the link lines 22. An area in which link lines 22 are formed is referred to as a panel link region. A width of the panel link region is referred to as a panel link length ($W_A$). In order to connect the data lines and the gate lines to the TCP 10 like the ribs of a fan as described above, each link line 22 has to be extended by an appropriate extension length ($L_P$). Thus, a panel link region having an appropriate panel link length ($W_A$) is required.

When fabricating a high-resolution LCD device, because of a corresponding increase in the number of gate lines, data lines, TCP output lines, and link lines, the extension lengths of link lines have to be correspondingly increased to maintain the intervals between link lines. Accordingly, the panel link length increases correspondingly in high-resolution applications. Moreover, various lines are formed within the panel link region to supply various control signals or image signals to an active area. Thus, if a panel link length increases, the LCD device correspondingly increases in weight and size of a LCD.

SUMMARY OF THE INVENTION

Accordingly, the present invention is directed to a liquid crystal display device that substantially obviates one or more of the problems due to limitations and disadvantages of the related art.

An object of the present invention is to provide a flat and light liquid crystal display device.

Another object of the present invention is to provide a liquid display device with a reduced panel area.

Another object of the present invention is to provide a liquid display device with an improved image display quality.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, the liquid crystal display device includes first and second substrates facing each other and attached to each other with a cell-gap therebetween, gate lines and data lines arranged horizontally and vertically on the first substrate. First lines are formed on the first substrate, connected to the gate lines or the data lines, and each having a link bending point and bent at an angle. A TCP is electrically attached to the first substrate. Second lines are formed on the TCP and electrically connected to the first lines respectively. At least one link bending point is positioned at a region of the TCP.

In another aspect, the liquid crystal display device includes first and second substrates facing each other and attached to each other with a cell-gap therebetween, a plurality of first lines formed on the first substrate and each having a link bending point at which the first line is bent at an angle, and a plurality of second lines electrically connected to the first lines respectively. The TCP has a slanted portion at an edge thereof. At least one link bending point is positioned on the slanted portion of the TCP.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a unit of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
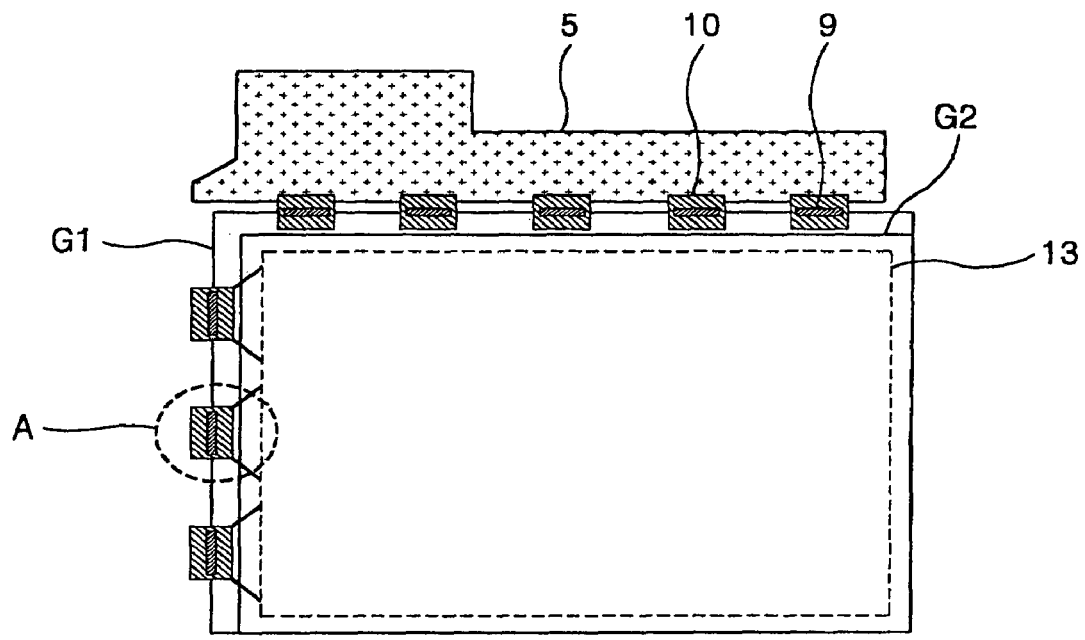
FIG. 1A is a view of a related art LCD device employing a TAB method.
Figure 1B:
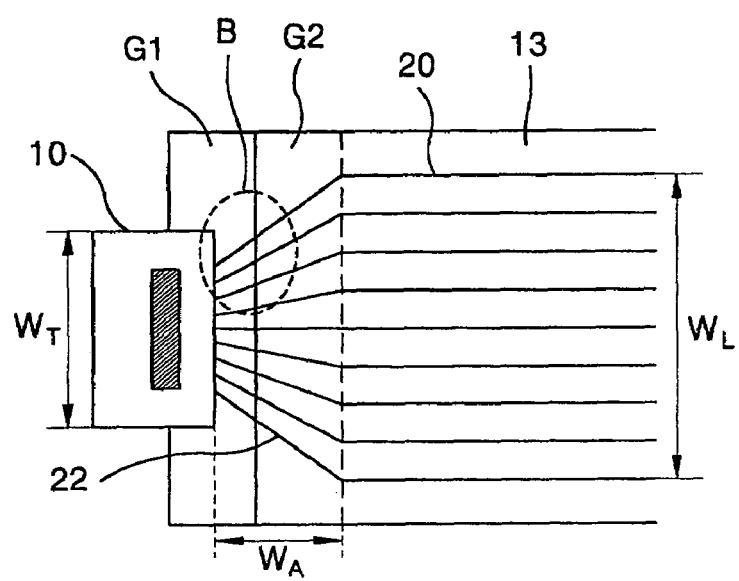
FIG. 1B is an enlarged view of a portion 'A' of the related art LCD device depicted in FIG. 1A.
Figure 1C:
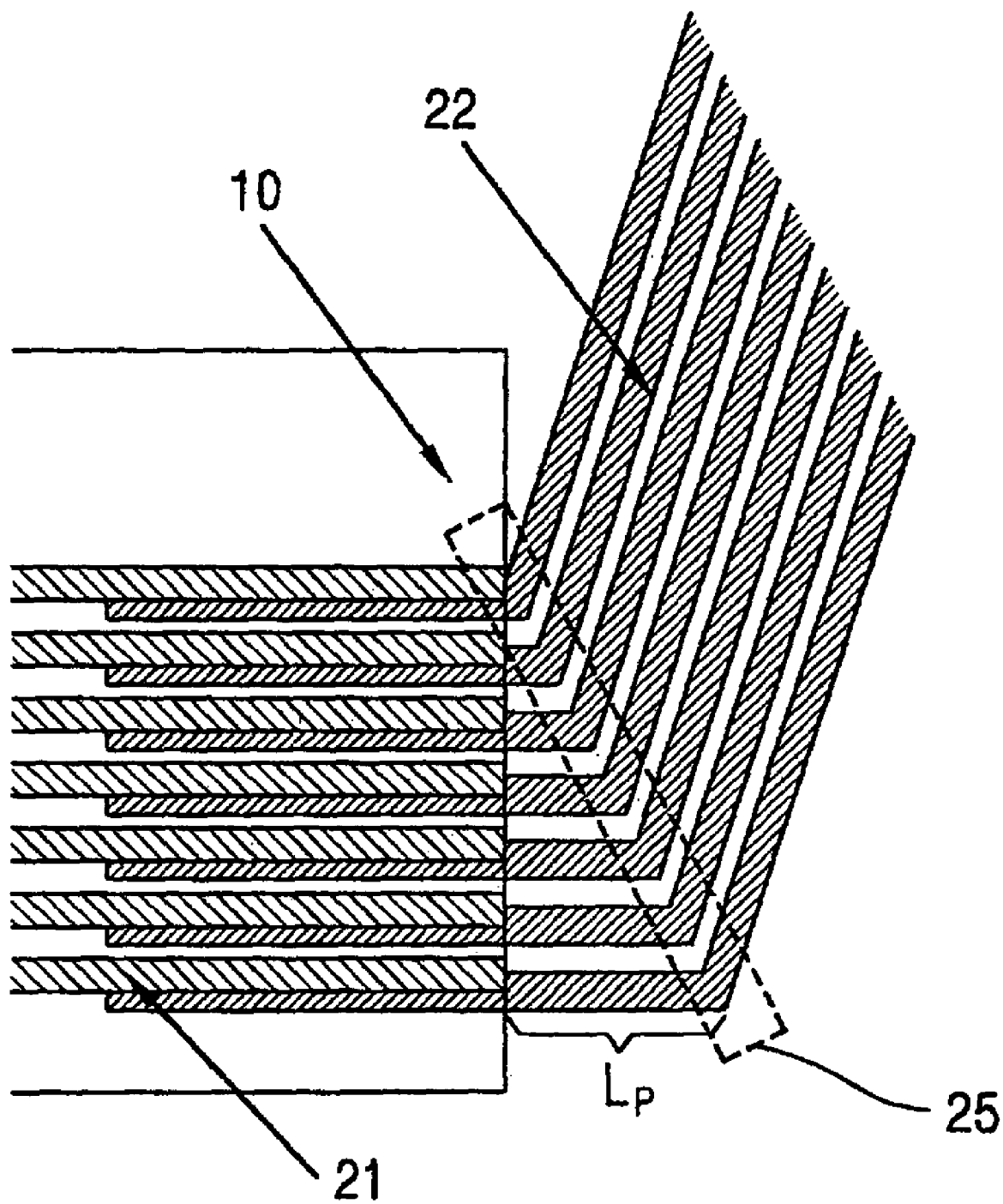
FIG. 1C is an enlarged view of a portion 'B' of the related art LCD device depicted in FIG. 1B, showing a connection between a TCP output line and a link line.
Figure 2A:
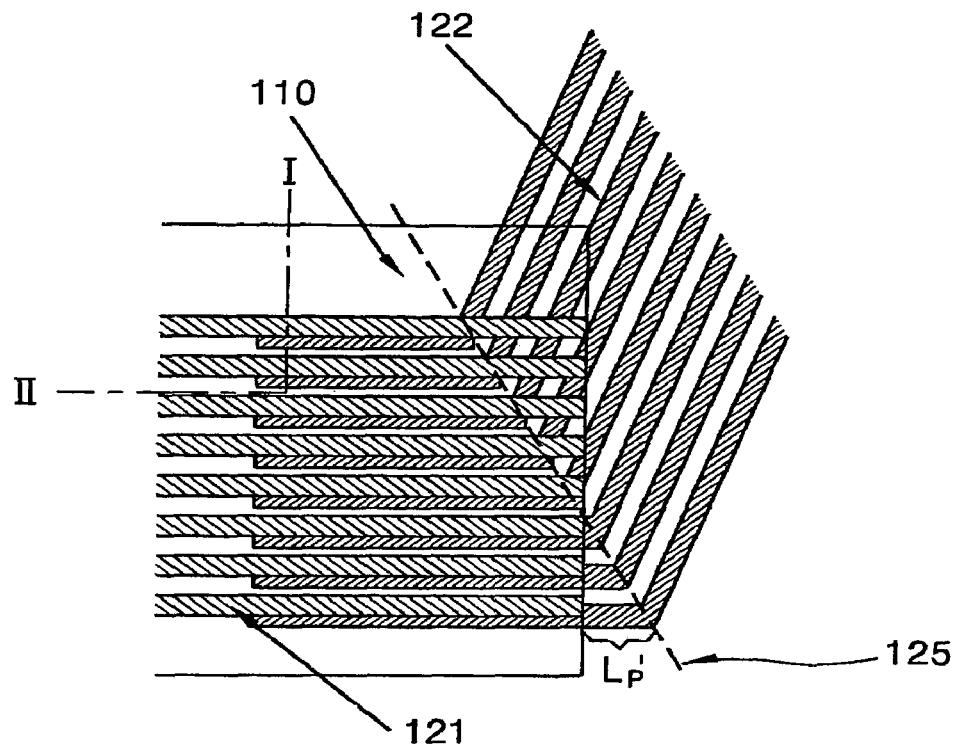
FIG. 2A is an enlarged view of an exemplary LCD device in accordance with a first embodiment of the present invention, showing a connection portion of a TCP output line and a link line.

FIG. 2A is an enlarged view of an exemplary LCD device in accordance with a first embodiment of the present invention, showing a connection portion of a TCP output line and a link line. As shown in FIG. 2A, TCP output lines 121 are formed on a TCP 110. Link lines 122 are formed on an LCD panel. The TCP output lines 121 and the link lines 122 are electrically connected.

Referring to FIG. 2A, corresponding TCP output lines 121 and link lines 122 overlap one another within a first region of the TCP, and are connected to each other. In embodiments of the present invention, some of the link lines 122 are bent within a second region of the TCP 110 such that the bent link lines 122 are overlapped with the TCP output lines 121 in the second region of the TCP 110. The points at which each of the links 122 bend are link bending points 125. Specifically, some of the bending points 125 of the link lines 122 are overlapped by the TCP output lines 121 in the second region. Accordingly, some of the link bending points 125 are covered because of their overlap by the TCP output lines 121 in the second region of the TCP 110, which are attached to a thin film transistor array substrate.

In accordance with the first embodiment of the present invention, an extension length ($L_P'$) of each link line 122 is shorter in comparison to the related art. Moreover, a plurality of the link lines 122 do not require an extension length ($L_P'$) because they are bent at link bending points 125 in the second region of the TCP 110 where the link lines 122 are overlapped with the TCP output lines 121. Accordingly, a panel link length can be reduced.

However, when the TCP output lines 121 overlap the link bending points 125 in the second region of the TCP 110 as set forth above, a connection may occur between a bent link line 122 having a bending point 125 within the second region of the TCP 110, and an adjacent TCP output line 121 other than the corresponding TCP output line 121. Such a connection between a bent link line 122 and an adjacent TCP output line 121 will cause a short-circuit. Such a short-circuit will impair the transmission of an accurate signal through the affected lines, thereby degrading the quality of a displayed image.

Figure 2B:
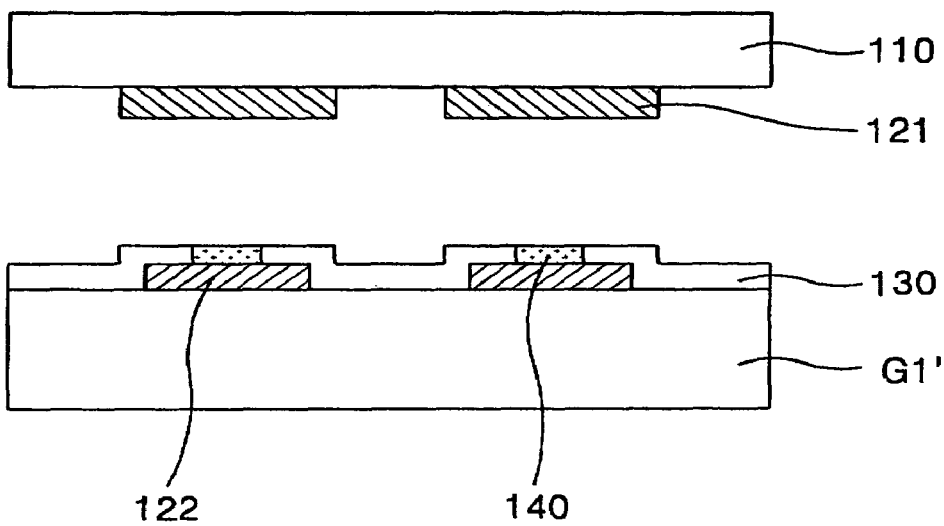
FIG. 2B is an exemplary sectional view taken along line I-II of FIG. 2A in accordance with a second embodiment of the present invention.

FIG. 2B is an exemplary sectional view taken along line I-II of FIG. 2A in accordance with a second embodiment of the present invention. In the second embodiment of the invention, an insulation film is formed on the link line 122 to prevent the short-circuit discussed above. As shown in FIG. 2B, the link line 122 is formed on the thin film transistor array substrate G1'. An insulation film 130 is formed on the link line 122. The insulation film 130 is formed on the entire panel link region. Thus, the insulation film 130 covers the link lines 122 and an exposed portion of the substrate. A contact hole 140 is formed through the insulation film 130 to expose a portion of the link line 122. The contact hole 140 is filled with a conductive material. The conductive material may be a transparent conductive material, for example ITO (Indium Tin Oxide).

The TCP output line 121 is formed on the TCP 110. When the TCP 110 is attached to the thin film transistor array substrate G1', each TCP output line 121 is electrically connected only to a corresponding link line 122 through the contact hole 140 filled with the conductive material, for example ITO. Thus, a short-circuit is prevented because each corresponding link line 122 is only connected to the corresponding TCP output line 121 through the contact hole.

In the process of insulating the link line 122, an insulation film may be formed only within the second region where the link lines 122 bend at the link bending points 125 are overlapped with the neighboring TCP output lines 121.

In FIG. 2B, the insulation film 130 is formed on the thin film transistor array substrate G1', and the contact hole 140 is formed through the insulating film 130. However, the insulation film 130 may be formed on the TCP 110, thereby insulating the TCP output line 121 and the link line 122. Then, the contact hole 140 should be formed by removing the insulation film in a region corresponding to the TCP output line 121.

By the above-mentioned insulation methods, a TCP structure which can prevent a short-circuit between the link lines 122 and the neighboring TCP output lines 121 can be formed, thereby decreasing the panel link length.

In a second embodiment of the present invention, a short-circuit between the TCP output line 121 and the link line 122 is prevented by forming the insulation film within the second region, where the neighboring TCP output line 121 and the link line 122 are overlapped, or over an entire panel link region. However, if the insulation film is destroyed or damaged due to high pressure or heat applied in TCP bonding, while attaching the TCP 110 to the thin film transistor array substrate G1', the TCP output line 121 and the link line 122 may electrically come in contact with each other through the damaged part of the insulation film, thereby causing a short-circuit.

To address the potential short-circuit due to destruction or damage of the insulation film, and ensure the reliability of the insulating film between the TCP output line 121 and the link line 122, an improved TCP structure is disclosed in accordance with a third embodiment of the present invention.

Figure 3A:
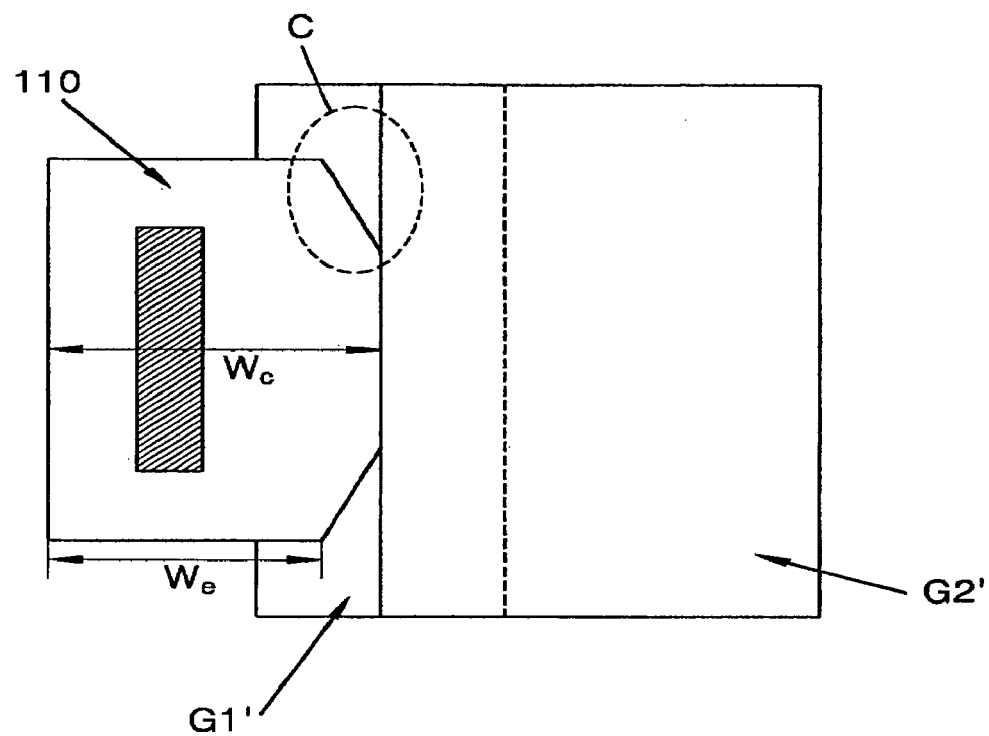
FIG. 3A depict a connection of a TCP to an exemplary LCD device in accordance with a third embodiment of the present invention.

FIG. 3A depicts a connection of a TCP to an exemplary LCD device in accordance with a third embodiment of the present invention. As shown therein, a structure of a third embodiment is similar to the TCP structure of the first embodiment except for a change in the position of a link bending point, at which a link line 122 is bent.

Referring to FIG. 3A, both ends of a TCP 110, which is attached to an edge G1' of a thin film transistor array substrate of an LCD panel, are removed obliquely. Herein, both ends of the TCP 110 are processed obliquely to remove the extension of the TCP output lines beyond the link bending points. Accordingly, when link bending points are formed on the TCP 110, spurious connections between the link lines 122 and adjacent TCP output lines 121 are prevented, thus avoiding the potential short-circuit described in reference to the first embodiment.

Figure 3B:
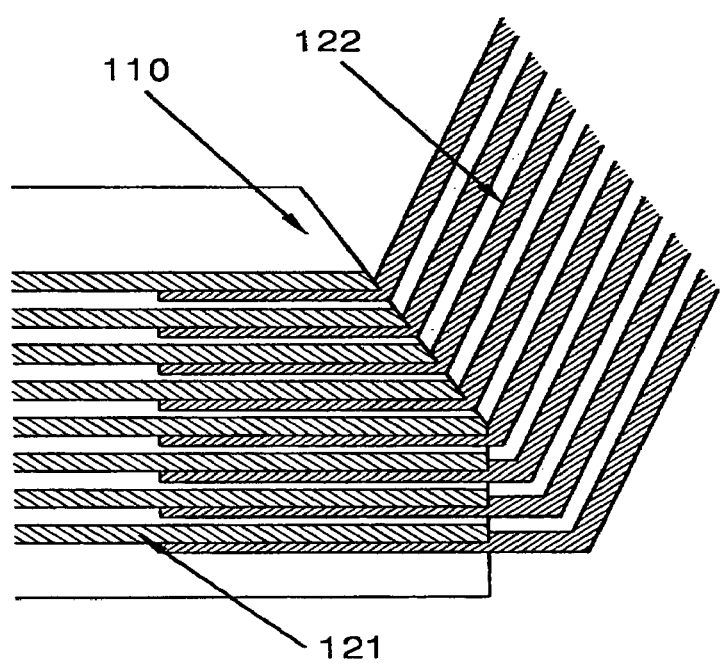
FIG. 3B is an enlarged view of a portion 'C' of FIG. 3A depicting a connection portion of a TCP output line and a link line.

FIG. 3B is an enlarged view of a portion 'C' of FIG. 3A depicting a connection portion of a TCP output line and a link line. As shown in FIG. 3B, when both edges of the TCP 110 are removed obliquely, the second region depicted in FIG. 2, where a plurality of the TCP output lines 121 overlap some of the link lines 122, is removed. The link bending points of the link lines 122 formed at the oblique area are positioned on one side of the TCP 110. Accordingly, a short-circuit between the TCP output lines 121 and the link lines 122 is prevented.

As shown in FIG. 3A, when both ends of the TCP 110 have been removed at an oblique angle. A width (Wc) of a central region of the TCP 110 is different than a width (We) at its edge. The oblique angle depends on a position of a link bending point on the TCP 110, an interval between the link lines 122, and an angle between the TCP output line 121 and the link line 122. Thus, even if the number of link lines 122 is larger than in the related art, the link lines 122 can be arranged at regular intervals within panel line region of the same size because the link bending points are formed along the slanted edge. The bending points of the link lines 122 formed within a central region of the TCP 110 are formed after the link lines 122 have been extended from a side of the TCP 110 by lengths similar to the first embodiment. Specifically, the link bending points formed within the central region of the TCP 110 are formed outside the TCP 110 region.

In the third embodiment of the present invention, the occurrence of a short-circuit between the link lines 122 and adjacent TCP output lines 121 can be prevented without using a special insulating film. Thus, the issue of reliability of the insulation film of the first embodiment can be resolved. In addition, because the link lines are bent on the end portions of the slanted sides made by removing both ends of the TCP obliquely, even if the number of link lines 122 increases, they can be arranged at regular intervals to fit even within a small panel line region. Moreover, a panel link length can be reduced. Accordingly, the size of the LCD device can be reduced.

It will be apparent to those skilled in the art that various modifications and variations can be made in the liquid crystal display device of the present invention without departing from the spirit or scope of the invention. Thus, it is intended that the present invention cover the modifications and variations of this invention provided they come within the scope of the appended claims and their equivalents.

What is claimed is:
1. A liquid crystal display device, comprising:
first and second substrates facing each other and attached to each other with a cell-gap therebetween;
gate lines and data lines arranged horizontally and vertically on the first substrate;
link lines formed on the first substrate, connected to the gate lines or the data lines, each link line comprising a link bending point and bent at an angle, the link lines being extended from the gate lines or the data lines;
an insulation film formed on the first substrate including the link lines, and comprising a contact hole exposing a portion of the link lines;
an Indium Tin Oxide (ITO) filled within the contact hole and being in contact with an exposed portion of the link lines;
a tape carrier package (TCP) electrically attached to the first substrate, the TCP comprising a first region and a second region on the basis of the link bending points of the link lines; and
output lines formed on a lower surface of the TCP and electrically connected to the link lines at the exposed portion of the link lines, respectively,
wherein some of the link bending points of the link lines are positioned at inside of the TCP, and others of the link bending points of the link lines are positioned at outside the TCP,
wherein the link lines and the output lines are overlapped at the first region of the TCP and each of the output lines at the first region of the TCP is connected with each of the link lines through the ITO filled within the contact hole, respectively, and parts of the output lines extended at the second region of the TCP from the first region of the TCP on the basis of the link bending points of the link lines are insulated with the bent link lines by the insulation film on the second region of the first substrate, wherein the contact hole is formed within the insulation film at the first region of the TCP, wherein a length of each of the link lines is from one side of the TCP to a corresponding link bending point, and the extended lengths of the plurality of extended link lines are different from each other, and wherein the link bending points become more distant from the side of the TCP as it goes from both ends of the TCP toward its central portion.

2. A liquid crystal display device, comprising:

first and second substrates facing each other and attached to each other with a cell-gap therebetween;

gate lines and data lines arranged horizontally and vertically on the first substrate;

link lines formed on the first substrate, connected to the gate lines or the data lines, each link line comprising a link bending point and bent at an angle, the link lines being extended from the gate lines or the data lines;

an insulation film formed on the first substrate including the link lines;

contact holes formed on the insulation film to expose a portion of the link lines, the contact holes being filled with an Indium Tin Oxide (ITO);

a tape carrier package (TCP) electrically attached to the first substrate through the ITO within the contact hole, the TCP comprising a first region and a second region on the basis of the link bending points of the link lines; and output lines formed on a lower surface of the TCP and electrically connected to the link lines at the exposed portion of the link lines, respectively, wherein some of the link bending points of the link lines are positioned at inside of the TCP, and some of the link bending points of the link lines are positioned at outside the TCP, wherein the link lines and the output lines are overlapped at the first region of the TCP and each of the output lines at the first region of the TCP is connected with each of the link lines through the ITO filled within the contact hole, respectively, and parts of the output lines extended at the second region of the TCP from the first region of the TCP on the basis of the link bending points of the link lines are insulated with the bent link lines by the insulation film on the second region of the first substrate, wherein the contact hole is formed within the insulation film at the first region of the TCP, wherein each of the output lines is overlapped with some portion of at least one of the link lines, wherein a length of each of a plurality of the link lines is from one side of the TCP to a corresponding link bending point, and the extended lengths of the plurality of extended link lines are different from each other, and wherein the link bending points become more distant from the side of the TCP as it goes from both ends of the TCP toward its central portion.

* * * * *